(12) United States Patent
Hwang et al.

(10) Patent No.: US 8,901,598 B2
(45) Date of Patent: Dec. 2, 2014

(54) LIGHT EMITTING DEVICE

(71) Applicant: Samsung Electronics Co., Ltd., Suwon-Si, Gyeonggi-Do (KR)

(72) Inventors: Jun-sik Hwang, Hwaseong-si (KR); Jun-youn Kim, Hwaseong-si (KR); Su-hee Chae, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/856,716

(22) Filed: Apr. 4, 2013

(65) Prior Publication Data

US 2014/0124818 A1 May 8, 2014

(30) Foreign Application Priority Data

Nov. 5, 2012 (KR) .................. 10-2012-0124474

(51) Int. Cl.
*H01L 33/00* (2010.01)
*H01L 33/12* (2010.01)

(52) U.S. Cl.
CPC ............ *H01L 33/0079* (2013.01); *H01L 33/12* (2013.01)
USPC ................... 257/99; 257/94; 257/98; 438/29; 438/33

(58) Field of Classification Search
USPC ....... 257/94, 98, 99, E33.072; 438/29, 33, 98
See application file for complete search history.

(56) References Cited

U.S. PATENT DOCUMENTS

| 2008/0290349 | A1* | 11/2008 | Takahashi ................. 257/79 |
| 2009/0008647 | A1* | 1/2009 | Li et al. ..................... 257/76 |
| 2010/0123158 | A1* | 5/2010 | Kim et al. .................. 257/99 |
| 2010/0143707 | A1* | 6/2010 | Sasaoka et al. ........... 428/332 |

FOREIGN PATENT DOCUMENTS

| JP | 2007013191 A | 1/2007 |
| KR | 20050063493 A | 6/2005 |
| KR | 100774198 B1 | 11/2007 |
| KR | 20100055866 A | 5/2010 |
| KR | 101171359 B1 | 8/2012 |

* cited by examiner

*Primary Examiner* — Phuc Dang

(74) *Attorney, Agent, or Firm* — Harness, Dickey & Pierce, P.L.C.

(57) ABSTRACT

A light emitting device (LED) includes a stress control layer having a compressive stress on a substrate, a bonding layer on the stress control layer, a semiconductor layer on the bonding layer and including an active region for emitting light on the bonding layer, a first electrode on a lower surface of the substrate, and a second electrode on the semiconductor layer. The compressive stress of the stress control layer is between about 1 and about 20 GPa.

17 Claims, 3 Drawing Sheets

LIGHT EMITTING DEVICE

CROSS-REFERENCE TO RELATED APPLICATION

This application claims the benefit of Korean Patent Application No. 10-2012-0124474, filed on Nov. 5, 2012 in the Korean Intellectual Property Office, the disclosure of which is incorporated herein in its entirety by reference.

BACKGROUND

1. Field

Example embodiments relate to a light emitting device fabricated using wafer bonding and a method of fabricating the light emitting device using wafer bonding.

2. Description of the Related Art

The advantage of light emitting diodes (LEDs) using a semiconductor material, e.g., a Group III-V nitride semiconductor, is that LEDs may be relatively small and lightweight and have a relatively long lifespan. A variety of technologies have been developing so as to increase efficiency of LEDs. High output and high brightness LEDs have recently attracted attention to be used as an illumination apparatus. However, in a case where a relatively high power is applied to LEDs for relatively high output, the efficiency of LEDs is reduced compared to that of a case where lower power is applied thereto.

Vertical LEDs having a high efficiency in applying current thereto have been proposed. Unlike horizontal LEDs in which a part of a semiconductor layer is etched and electrodes are formed in the etched portion of the semiconductor layer, electrodes are directly disposed on upper and lower surfaces of a semiconductor layer in vertical LEDs, and thus current may be efficiently applied from electrodes to the semiconductor layer. Therefore, vertical LEDs may obtain enhanced efficiency and output compared to horizontal LEDs. Also, vertical LEDs are more easily cooled compared to horizontal LEDs, thereby more easily dissipating heat generated during operation.

Vertical LEDs in which electrodes are disposed on the upper and lower surfaces of the semiconductor layer require a different fabrication process from horizontal LEDs. For example, after growing the semiconductor layer on a growth substrate, e.g., sapphire, the growth substrate needs to be removed so as to perform the remaining processes (i.e. subsequent processes). In this regard, before removing the growth substrate, the semiconductor layer is bonded onto another substrate so as to support the semiconductor layer from which the growth substrate is removed. Such bonding is performed in a wafer scale, which is referred to as wafer bonding.

A tensile stress is generated in the semiconductor layer during a cooling process. When the growth substrate on which the semiconductor layer is formed is bonded to a transfer wafer, wafer may be warped due to the tensile stress during the cooling process after wafer bonding, and cracks may occur in the semiconductor layer. If the growth substrate is removed, the tensile stress in the semiconductor layer may increase. Accordingly, a manufacturing yield of LEDs may be reduced.

SUMMARY

Example embodiments provide methods of fabricating a light emitting device (LED) using wafer bonding that prevents or reduces warping. Example embodiments also provide LEDs fabricated using the above methods.

Additional aspects will be set forth in part in the description which follows and, in part, will be apparent from the description, or may be learned by practice of the example embodiments.

According to example embodiments, a light emitting device (LED) may include a stress control layer on a substrate, the stress control layer having a compressive stress, a bonding layer on the stress control layer, a semiconductor layer on the bonding layer, the semiconductor layer including an active region configured to emit light on the bonding layer, a first electrode on a lower surface of the substrate, and a second electrode on the semiconductor layer.

The compressive stress of the stress control layer may be between about 1 and about 20 GPa. The stress control layer may include a conductive nitride. The conductive nitride may be one of titanium nitride (TiN) and tantalum nitride (TaN). A thickness of the stress control layer may be in a range of about 10 nm to about 10 μm. An adhesion layer may be between the stress control layer and the substrate. The adhesion layer may include titanium (Ti). The bonding layer may be a conductive layer formed of one of tin (Sn), gold (Au), copper (Cu), silver (Ag), aluminum (Al), nickel (Ni) and alloys thereof.

According to example embodiments, a method of fabricating a light emitting diode (LED) may include forming a semiconductor layer on a growth substrate, the semiconductor layer including an active region for emitting light, forming a first bonding layer on the semiconductor layer, forming a stress control layer on a transfer substrate, the stress control layer having a compressive stress, forming a second bonding layer on the stress control layer, bonding the growth substrate to the transfer substrate by contacting the first bonding layer and the second bonding layer, and removing the growth substrate.

The stress control layer may be formed of a conductive nitride. Forming the stress control layer may include forming a nitride layer including a metal of a metal target on the transfer substrate by performing a reactive sputtering process on the metal target in an atmosphere of nitrogen. The metal target may include one of titanium (Ti) and tantalum (Ta). Forming the nitride layer may include supplying a volume of nitrogen gas between about 3 and about 5 times more than a volume of a carrier gas into a reactive sputtering chamber.

The stress control layer may be formed to a thickness in a range of about 10 nm to about 10 μm. The stress control layer may have the compressive stress between about 1 and about 20 GPa. Forming the first and second bonding layers may include forming at least one of tin (Sn), gold (Au), copper (Cu), silver (Ag), aluminum (Al), nickel (Ni), and compounds thereof.

The method may further include forming an adhesion layer on the growth substrate before the forming a stress control layer. The adhesion layer may be formed of titanium (Ti). The transfer substrate may be a conductive substrate, and the method may further include forming a first electrode on the transfer substrate and forming a second electrode on the semiconductor layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
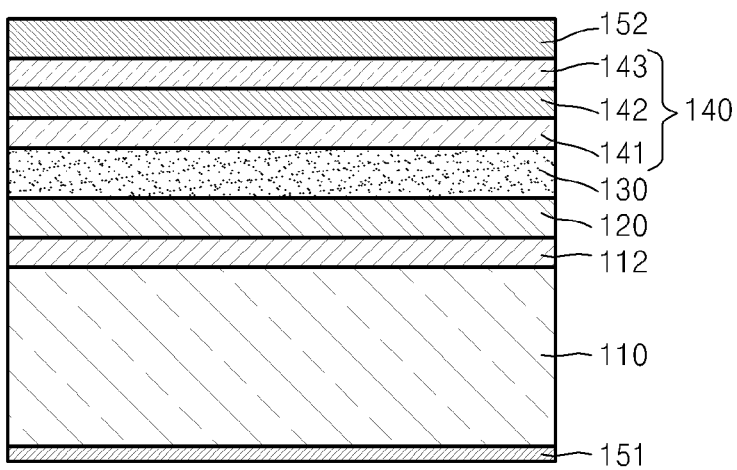
FIG. 1 is a schematic cross-sectional view illustrating a vertical light emitting device (LED) according to example embodiments.

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, the embodiments are merely described below, by referring to the figures, to explain aspects of the present description. It will be understood that when an element or layer is referred to as being "on" another element or layer, the element or layer can be directly on another element or layer or intervening elements or layers. In the drawings, lengths and sizes of layers and regions may be exaggerated for clarity. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

FIG. 1 is a schematic cross-sectional view illustrating a vertical light emitting device (LED) 100 according to example embodiments. Referring to FIG. 1, an adhesion layer 112, a stress control layer 120, and a bonding layer 130 may be sequentially formed on a substrate 110. A semiconductor layer 140 may be formed on the bonding layer 130. The semiconductor layer 140 may include a first semiconductor layer 141, an active layer 142, and a second semiconductor layer 143 that are sequentially stacked on the bonding layer 130. A first electrode 151 is formed on a lower surface of the substrate 110. A second electrode 152 is formed on the second semiconductor layer 143.

The substrate 110 may be a conductive substrate. The substrate 110 may be a silicon substrate doped with a first impurity. The first semiconductor layer 141, the active layer 142, and the second semiconductor layer 143 may be formed of a Group III-V nitride semiconductor. The first semiconductor layer 141 may be an n-type semiconductor layer. The second semiconductor layer 143 may be a p-type semiconductor layer. However, example embodiments are not limited thereto. For example, the first semiconductor layer 141 and the second semiconductor layer 143 may be the p-type semiconductor layer and the n-type semiconductor layer, respectively.

The active layer 142 may have a single-quantum well structure or a multiple-quantum well structure as an active region for recombining electrons and holes and generating light. The first electrode 151 may be an n-type electrode in a case where, for example, the first semiconductor layer 141 is the n-type semiconductor layer. The second electrode 152 may be a p-type electrode in a case where the second semiconductor layer 143 is the p-type semiconductor layer.

The second electrode 152 may be formed of indium tin oxide (ITO) that is a transparent electrode material. In a case when the second electrode 152 is formed of a metal material, the second electrode 152 may be disposed on a partial region of the second semiconductor layer 143. The adhesion layer 112 may be used to adhere the stress control layer 120 to the substrate 110. The adhesion layer 112 may be formed of titanium (Ti).

The stress control layer 120 may have a compressive stress between about 1 and about 20 GPa. The stress control layer 120 may be formed of a metal (e.g., titanium (Ti), tantalum (Ta), tungsten (W), nickel (Ni), aluminum (Al), and/or platinum (Pt)), a conductive nitride, or a conductive oxide. In a case when the stress control layer 120 is formed of metal, the adhesion layer 112 may be omitted.

The stress control layer 120 may be formed of a conductive nitride, e.g., TiN or TaN. Also, the stress control layer 120 may be formed of a conductive oxide, e.g., ITO.

A tensile stress may be formed in the semiconductor layer 140 that is epitaxially grown. If the semiconductor layer 140 is bonded to the stress control layer 120 having the compressive stress via the bonding layer 130, the tensile stress of the semiconductor layer 140 may be reduced by the stress control layer 120. This operation will be described later. The stress control layer 120 may have a thickness between about 10 nm and about 10 μm.

Figure 2A:
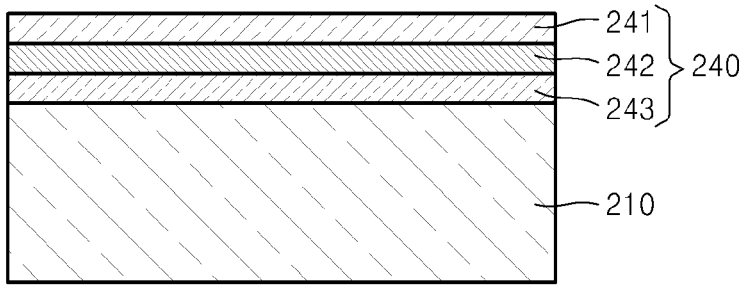
FIGS. 2A through 2F are cross-sectional views for explaining a method of fabricating a vertical LED according to example embodiments.

FIGS. 2A through 2F are cross-sectional views for explaining a method of fabricating a vertical LED according to example embodiments. Referring to FIG. 2A, a growth wafer used to grow the vertical LED is prepared. Hereinafter the growth wafer is referred to as a growth substrate 210 for convenience of description. The growth substrate 210 may be a silicon substrate having a diameter between about 6 inches and about 18 inches. The growth substrate 210 may be a silicon substrate having a thickness between about 500 μm and about 1500 μm.

However, the method of fabricating the vertical LED according to example embodiments does not necessarily need the silicon substrate having the diameter equal to or greater than 6 inches. That is, the method may use a smaller silicon substrate or a relatively small sapphire substrate.

A second semiconductor layer 243, an active layer 242, and a first semiconductor layer 241 that are formed of a Group III-V nitride semiconductor are sequentially epitaxially grown on the growth substrate 210. The first semiconductor layer 241 may be an n-type semiconductor layer. The second semiconductor layer 243 may be a p-type semiconductor layer. However, example embodiments are not limited thereto. For example, the first semiconductor layer 241 and the second semiconductor layer 243 may be the p-type semiconductor layer and the n-type semiconductor layer, respectively.

The active layer 242 may have a single-quantum well structure or a multiple-quantum well structure as an active region for recombining electrons and holes and generating light.

Hereinafter a stack including the second semiconductor layer 243, the active layer 242, and the first semiconductor layer 241 is referred to as a semiconductor layer 240 for convenience of description.

The Group III-V nitride semiconductor may be a GaN based semiconductor. The semiconductor layer 240 may be grown after forming a buffer layer, e.g., AlN, on the growth substrate 210.

Figure 2B:
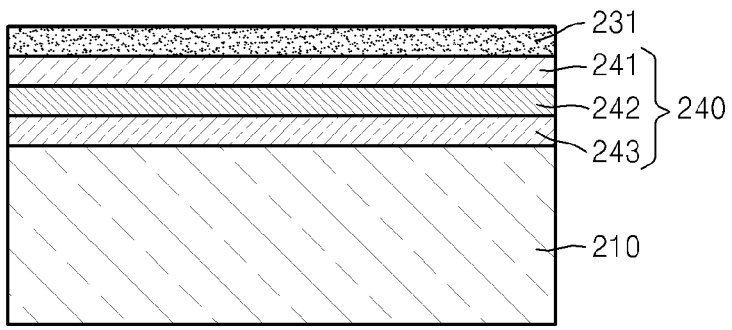
Figure 2C:
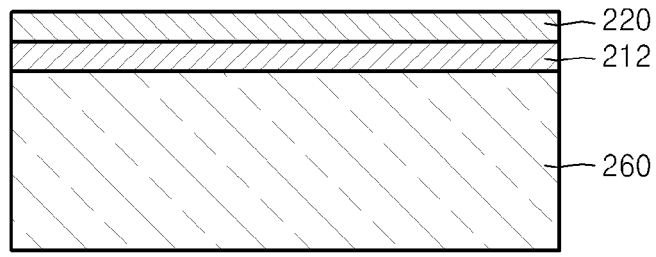

Referring to FIG. 2B, a first bonding layer 231 may be formed on the first semiconductor layer 241. The first bonding layer 231 may be formed of tin (Sn), gold (Au), copper (Cu), silver (Ag), aluminum (Al), and/or nickel (Ni), and may be formed in a monolayer or a multilayer. Referring to FIG. 2C, a transfer substrate 260 may be prepared. The transfer substrate 260 may be a conductive substrate having the same diameter as the growth substrate 210. For example, the transfer substrate 260 may be a conductive silicon substrate.

An adhesion layer 212 may be formed on the transfer substrate 260 by sputtering. The adhesion layer 212 may be a Ti layer. Thereafter, the stress control layer 220 may be formed on the adhesion layer 212. The transfer substrate 260 may be disposed in a reactive sputtering chamber. A Ti or Ta target may be disposed in the reactive sputtering chamber. A predetermined or given power may be applied to the reactive sputtering chamber in an atmosphere of nitrogen. A nitrogen gas of between about 50 and about 70 sccm may be supplied. An Ar gas of 15 sccm may be supplied as a carrier gas.

As a result, a stress control layer 220 having a compressive stress may be formed on the transfer substrate 260. The stress control layer 220 may have a compressive stress between about 1 and about 20 GPa. The stress control layer 220 may have a thickness of between about 10 nm and about 10 μm.

After a silicon wafer having a thickness of 0.7 mm and a diameter of 8 inches is disposed in the reactive sputtering chamber, when a power of 18 kW is supplied to the reactive sputtering chamber, a TiN composition of the stress control layer 220 and a value of the compressive stress varies as shown in Table 1 according to a gas supply ratio of Ar:N$_2$ in the reactive sputtering chamber.

TABLE 1

| Ar:N$_2$ ratio (sccm) | TiN composition | compressive stress, MPa |
|---|---|---|
| 15:45 | Ti rich (6 at. %) | 7,286 |
| 15:62 | Ti:Ni = 1:1 (at. ratio) | 10,040 |
| 15:75 | N rich (7 at. %) | 4,271 |

As shown in Table 1 above, if the nitrogen gas is supplied between about 3 to about 5 times more than the argon gas is supplied to the reactive sputtering chamber, the stress control layer 220 has the compressive stress of about 4~10 GPa.

In a case where the TiN composition is 1:1, the stress control layer 220 has the greatest compressive stress. If a supply amount of the nitrogen gas increases, N rich TiN is formed. If the supply amount of the nitrogen gas decreases, Ti rich TiN is formed.

Figure 2D:
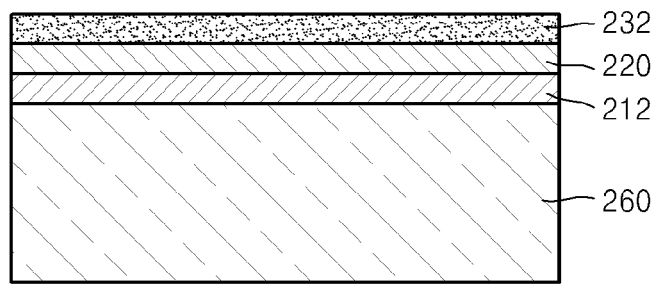

Referring to FIG. 2D, a second bonding layer 232 is formed on the stress control layer 220. The second bonding layer 232 may be formed of tin (Sn), gold (Au), copper (Cu), silver (Ag), aluminum (Al), and/or nickel (Ni), and may be formed in a monolayer or a multilayer.

Figure 2E:
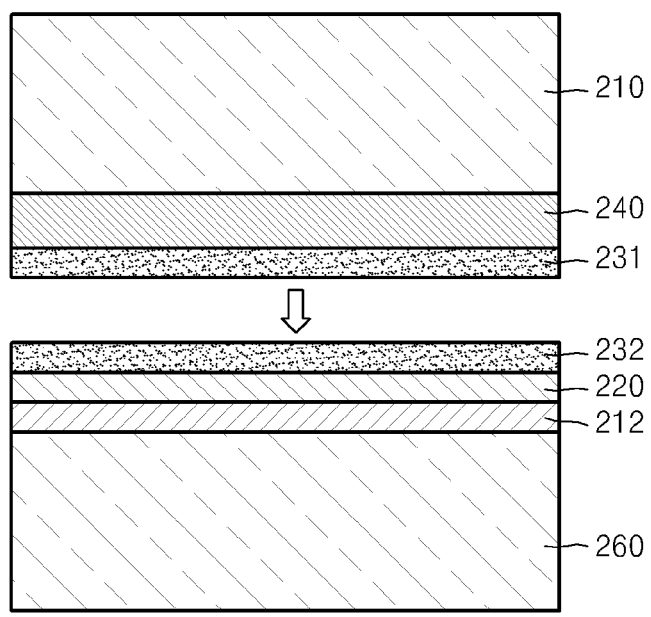

Referring to FIG. 2E, the growth substrate 210 is bonded on the transfer substrate 260 at a wafer level. While the growth substrate 210 is stacked on the transfer substrate 260 for wafer level bonding, the first bonding layer 232 may be disposed on the second bonding layer 232. If a predetermined or given temperature and pressure are applied to the growth 210 and the transfer substrate 260, the first bonding layer 231 and the second bonding layer 232 may be coupled to each other due to eutectic bonding. The first bonding layer 231 and the second bonding layer 232 that are coupled to each other correspond to the bonding layer 130 of FIG. 1. Coupling of the semiconductor layer 240 having the tensile stress and the stress control layer 220 having the compressive stress may result in a reduction in warpage of the semiconductor layer 240.

Figure 2F:
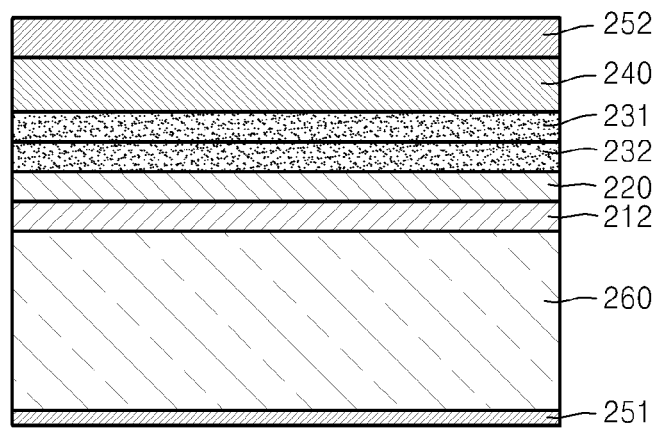

Referring to FIG. 2F, the growth substrate 210 may be removed. A laser lift-off process may be used to remove the growth substrate 210.

After removing the growth substrate 210, a general semiconductor process is used to form a first electrode 251 on a lower surface of the transfer substrate 260, and a second electrode 252 is formed on the semiconductor layer 240. The first electrode 251 may be formed of metal, e.g., Al and/or Au. The second electrode 252 may be formed of a transparent electrode, e.g., ITO. If the above resultant is diced, the resultant of FIG. 1 is fabricated.

Although the ITO electrode is used as the second electrode 252, example embodiments are not limited thereto. For example, the second electrode 252 may be a metal electrode formed on a partial region of the semiconductor layer 240.

Although a conductive transfer substrate is used, example embodiments are not limited thereto. For example, an insulation transfer substrate may be used, and a via is formed in the insulation transfer substrate and filled with a metal to electrically connect the second electrode 252 and the semiconductor layer 240. A detailed description thereof will be omitted here.

As described above, according to example embodiments, a stress control layer having a compressive stress reduces a deformation due to a tensile stress of a semiconductor layer, and restrains a crack in the semiconductor, thereby fabricating a wafer having a semiconductor layer with desirable qualities. Thus, a LED having desirable qualities may be fabricated.

It should be understood that example embodiments described herein should be considered in a descriptive sense only and not for purposes of limitation. Descriptions of features or aspects within each embodiment should typically be considered as available for other similar features or aspects in other embodiments.

What is claimed is:

1. A light emitting device (LED) comprising:
a conductive semiconductor substrate;
a stress control layer on the conductive semiconductor substrate, the stress control layer having a compressive stress and including a conductive nitride;
a bonding layer on the stress control layer;
a semiconductor layer on the bonding layer, the semiconductor layer including an active region configured to emit light on the bonding layer;
a first electrode on a lower surface of the substrate; and
a second electrode on the semiconductor layer.

2. The LED of claim 1, wherein the compressive stress of the stress control layer is between about 1 and about 20 GPa.

3. The LED of claim 2, wherein the conductive nitride is one of titanium nitride (TiN) and tantalum nitride (TaN).

4. The LED of claim 1, wherein a thickness of the stress control layer is in a range of about 10 nm to about 10 μm.

5. The LED of claim 2, further comprising:
an adhesion layer between the stress control layer and the substrate.

6. The LED of claim 5, wherein the adhesion layer includes titanium (Ti).

7. The LED of claim 2, wherein the bonding layer is a conductive layer formed of one of tin (Sn), gold (Au), copper (Cu), silver (Ag), aluminum (Al), nickel (Ni) and alloys thereof.

8. A method of fabricating a light emitting diode (LED), the method comprising:
forming a semiconductor layer on a growth substrate, the semiconductor layer including an active region for emitting light;
forming a first bonding layer on the semiconductor layer;
forming a stress control layer on a conductive transfer substrate, the stress control layer having a compressive stress and including a conductive nitride;
forming a second bonding layer on the stress control layer;
bonding the growth substrate to the conductive transfer substrate by contacting the first bonding layer and the second bonding layer; and
removing the growth substrate.

9. The method of claim 8, wherein the forming a stress control layer includes forming a nitride layer including a metal of a metal target on the transfer substrate by performing a reactive sputtering process on the metal target in an atmosphere of nitrogen.

10. The method of claim 9, wherein the forming a nitride layer includes forming the metal target including one of titanium (Ti) and tantalum (Ta).

11. The method of claim 10, wherein the forming a nitride layer includes supplying a volume of nitrogen gas between about 3 and about 5 times more than a volume of a carrier gas into a reactive sputtering chamber.

12. The method of claim 10, wherein the forming a stress control layer includes forming the stress control layer to a thickness in a range of about 10 nm to about 10 μm.

13. The method of claim 10, wherein the forming a stress control layer includes forming the stress control layer to have the compressive stress between about 1 and about 20 GPa.

14. The method of claim 8, wherein the forming a first bonding layer and the forming a second bonding layer includes forming at least one of tin (Sn), gold (Au), copper (Cu), silver (Ag), aluminum (Al), nickel (Ni), and compounds thereof.

15. The method of claim 8, further comprising:
forming an adhesion layer on the growth substrate before the forming a stress control layer.

16. The method of claim 15, wherein the forming an adhesion layer includes forming titanium (Ti).

17. The method of claim 8, wherein the transfer substrate is a conductive substrate, the method further comprising:
forming a first electrode on the transfer substrate; and
forming a second electrode on the semiconductor layer.

* * * * *